United States Patent
Kutsch et al.

(10) Patent No.: US 6,874,511 B2
(45) Date of Patent: Apr. 5, 2005

(54) METHOD OF AVOIDING OR ELIMINATING DEPOSITS IN THE EXHAUST AREA OF A VACUUM SYSTEM

(75) Inventors: Bernd Kutsch, Stuttgart (DE); Franz Laermer, Weil der Stadt (DE)

(73) Assignee: Robert Bosch GmbH, Stuttgart (DE)

( * ) Notice: Subject to any disclaimer, the term of this patent is extended or adjusted under 35 U.S.C. 154(b) by 119 days.

(21) Appl. No.: 10/202,773

(22) Filed: Jul. 24, 2002

(65) Prior Publication Data

US 2003/0019506 A1 Jan. 30, 2003

(30) Foreign Application Priority Data

Jul. 24, 2001 (DE) .......................................... 101 36 022

(51) Int. Cl.$^7$ .......................................... H01L 21/302
(52) U.S. Cl. .......................... 134/22.1; 134/1.1; 216/67; 438/714; 438/734
(58) Field of Search ...................... 134/1.1, 1.2, 22.1; 216/74, 67; 438/714, 734

(56) References Cited

U.S. PATENT DOCUMENTS

| | | |
|---|---|---|
| 4,556,584 A | 12/1985 | Sarkozy |
| 4,647,338 A * | 3/1987 | Visser .......................... 438/710 |
| 4,655,800 A * | 4/1987 | Tsukada et al. ................ 96/136 |
| 5,051,060 A | 9/1991 | Fleischmann et al. |
| 5,501,893 A * | 3/1996 | Laermer et al. ............. 428/161 |
| 5,819,683 A * | 10/1998 | Ikeda et al. ................. 118/724 |
| 6,238,588 B1 * | 5/2001 | Collins et al. ................ 216/68 |
| 6,531,068 B2 * | 3/2003 | Laermer et al. .............. 216/37 |

FOREIGN PATENT DOCUMENTS

| | | |
|---|---|---|
| DE | 34 32 033 | 3/1985 |
| DE | 42 41 045 | 5/1994 |
| DE | 198 26 382 | 12/1999 |
| JP | 61-178026 | 8/1986 |
| JP | 8-299784 | 11/1996 |
| JP | 09-279351 | * 10/1997 |
| JP | 2001-189277 | * 7/2001 |

* cited by examiner

Primary Examiner—George A. Goudreau
(74) Attorney, Agent, or Firm—Kenyon & Kenyon

(57) ABSTRACT

Method of avoiding or eliminating deposits in the exhaust area of a vacuum system in which a gas containing depositable constituents in the exhaust area is at least intermittently pumped out of a vacuum chamber that is connected to a vacuum pump via a gas line. A reactive gas that removes deposits from the gas in the vacuum pump and/or units provided downstream therefrom, and/or reduces or eliminates existing deposits in this area is at least intermittently added to the gas directly upstream from or within the vacuum pump. The proposed method is particularly suitable for anisotropic plasma etching of silicon using alternating etching steps and polymerization steps, the vacuum chamber being supplied with a sulfur-containing etching gas during the etching steps and a polymerizing agent-containing gas during the polymerization steps.

12 Claims, 3 Drawing Sheets

METHOD OF AVOIDING OR ELIMINATING DEPOSITS IN THE EXHAUST AREA OF A VACUUM SYSTEM

FIELD OF THE INVENTION

The present invention relates to a method of avoiding or eliminating deposits in the exhaust area of a vacuum system, in particular when plasma etching silicon using alternating etching and polymerization steps.

BACKGROUND INFORMATION

In the case of anisotropic plasma etching of silicon according to the method described in German Patent No. 42 41 045, a certain amount of harmful polymer deposits and/or sulfur deposits occur in the vacuum components of the etching system, i.e., particularly in the turbopump, exhaust lines, and backing pump used. This results from the decomposition of the employed process gas sulfur hexafluoride ($SF_6$) excited by plasma with the release of fluorine resulting in elementary sulfur or from the formation of polymerizable monomers from the process gas $C_4F_8$ or $C_3F_6$, which is preferably used for side wall passivation, forming Teflon-like films.

To avoid deposits in the exhaust area, it was previously proposed in German Published Patent Application No. 198 26 382 that, oxygen be added in the proportion of 3 vol. % to 40 vol. % to the etching gas sulfur hexafluoride only during the etching steps according to the method in German Patent No. 42 41 045, i.e., not during the deposition steps or polymerization steps. This prevents the deposition of sulfur, for example, in the exhaust area and, in particular, in the area of the turbopumps located there, while also ensuring that the anisotropic plasma etching process is not significantly impaired.

However, the method according to German Published Patent Application No. 198 26 382 has a disadvantage in that, in the process according to German Patent No. 42 41 045, it is not possible to suppress any deposits other than sulfur present in the exhaust gas, for example polymers, since the oxygen admixture can only take place during the etching steps, but not during the polymerization steps during which polymer-forming compounds in the exhaust area are used. While it is therefore possible to suppress sulfur deposits in the exhaust area according to the teaching of German Published Patent Application No. 198 26 382, it is not possible to avoid unwanted polymer deposits.

In a departure from the general rule requiring the avoidance of oxygen in the polymerization steps, however, it has been found in certain special applications that the addition of small amounts of oxygen is advantageous even during this phase. In high-rate anisotropic etching processes using a ceramic ICP (inductively coupled plasma) process chamber, the addition of 3 to 10 sccm $O_2$, preferably 5 sccm $O_2$, to 200 sccm $C_4F_8$ greatly suppresses the formation of carbon micromasks. This addition is unnecessary when using quartz glass chambers, since in this case the wall made of $SiO_2$, on its own accord, releases a small but sufficient amount of oxygen in this magnitude, as a result of reactions with fluorine radicals resulting in $SiF_4$. Note, however, that the addition of 10 sccm $O_2$ to, for example, 200 sccm $C_4F_8$ is the maximum amount tolerated during the polymerization steps without producing side effects that impair the quality of the generated etching profile. In any case, this amount is insufficient for suppressing deposits in the exhaust area of the vacuum system.

According to another known method of suppressing deposits in the exhaust area of a vacuum system, a turbopump is provided with a "temperature management system", and a cold trap (cryotrap) is positioned downstream from the turbopump. Specifically, this means that the turbopump is heated to a relatively high operating temperature between 70° C. and 100° C. during vacuum system operation, with the result that no harmful polymer deposits or sulfur deposits initially occur therein. To achieve this, however, the turbopump must have magnetic bearings, since conventional ball bearings are not approved for these temperatures and are very quickly destroyed by bearing wear. This also means relying on a special and very expensive turbopump design.

In addition, turbopump heating prevents the deposition of the polymerizable species only within the pump, which merely transfers the problem to the exhaust line downstream from the turbopump, in particular to the backing pump located there, unless an additional cold trap is provided directly downstream from the turbopump to bind the harmful species in which the polymerizing agents are deposited and thus removed from the exhaust gas. However, this cold trap constitutes an additional cost factor in conjunction with the already expensive, special turbopump. In addition, the cold trap must be emptied regularly and its contents disposed of, which is not easily done in light of the toxic compounds that are frequently deposited.

SUMMARY OF THE INVENTION

An object of the present invention is to provide an alternative method to the teaching of German Published Patent Application No. 198 26 382, making it possible to suppress, i.e., remove, not only, for example, sulfur deposits, but also polymer deposits in the exhaust area of the vacuum system.

The method according to the present invention of avoiding or eliminating deposits in the exhaust area of a vacuum system has the advantage over the related art that a commercially available vacuum pump, preferably an ordinary chemical-resistant turbomolecular pump, which may be purchased at little cost in a number of different brands, is usable for carrying out the method.

A further advantage is that the method according to the present invention makes it unnecessary to use a cold trap, or "cryotrap," and does not produce any toxic or solid waste requiring disposal or expensive elimination.

A further advantage of the method according to the present invention is that the reactive gas may be added to the gas to be removed at multiple alternative or simultaneously usable locations in the exhaust area of the vacuum pump, enabling the optimum addition of reactive gas to be easily tailored to the requirements at hand.

It is particularly advantageous that, with the help of the method according to the present invention, not only are sulfur deposits suppressible in the exhaust area of the vacuum system, but also a precipitation, i.e., deposit, of polymerizable constituents is avoidable in the exhaust area. In addition, it enables previously formed deposits in the exhaust area to be removed or at least considerably reduced at a later time.

Thus, when using a turbomolecular pump as the vacuum pump, the bearing flushing device which is already part of such, in particular, chemical-resistant turbomolecular pumps and which is otherwise used to supply a protective gas stream of nitrogen that counteracts or prevents the entry of corrosive process gases into the bearing and motor unit of the turbomolecular pump is especially suitable for supplying the reactive gas to be added to the exhaust gas. The reactive gas supplied to the bearing flushing device thus enters the latter in the rear area of the turbomolecular pump, i.e., preferably in the area of the final rotor/stator package.

Alternatively or in addition, it is further possible to allow the reactive gas to enter the turbomolecular pump at a different point, gas inlets, for example, in the area of the rotor/stator arrangement of the turbomolecular pump, like those already often provided in such pumps in the factory for analyzing the pressure curve, being suitable for this purpose. Specifically, a reactive gas is supplied to the turbomolecular pump via the gas inlets in the area of the rotor/stator arrangement of the turbomolecular pump and subsequently mixed with the pumped gas containing depositable constituents within the turbomolecular pump.

Finally, a third advantageous method of adding the reactive gas to the pumped gas involves supplying the reactive gas to the turbomolecular pump immediately upstream from the latter's inlet opening, ensuring, however, that the supplied reactive gas is unable to diffuse back into the vacuum chamber connected to the turbomolecular pump.

Oxygen, in particular, pure oxygen, or air, is especially suitable as the reactive gas, i.e., pure oxygen or air, which oxidizes and thus renders harmless the polymerization-capable constituents delivered by the turbomolecular pump, is particularly well suited, and is supplied as the reactive gas instead of nitrogen via the protective gas supply line of the turbomolecular pump.

Because the unwanted deposition of polymerides or sulfur occurs practically only in the rear area of the turbomolecular pump, i.e., on the high-pressure side, it mainly affects the final stator/rotor package. Thus, even the supply of oxygen or air, in particular compressed air, via the bearing flushing device of the turbomolecular pump provides adequate protection of the pump through continuous back diffusion by the reactive gas leaving the bearing flushing device.

It is further advantageous for the reactive gas eliminating or avoiding deposits to be either permanently or only intermittently suppliable downstream from or within the vacuum pump, i.e., the supply of reactive gas no longer absolutely has to be turned off during the polymerization steps of a process of the type according to German Patent No. 42 41 045. A polymerization suppressing effect is thus provided in each process step.

However, depending on the process being carried out, it is also now advantageously possible to add the reactive gas suppressing polymerization and/or sulfur deposition only when a silicon substrate is being etched in the vacuum chamber and to use no gas or, for example, an inert gas supplied via the bearing flushing device of the turbopump at all other times, i.e., in particular when the vacuum pump is idle. The turbomolecular pump is thus, for example, first flushed with a protective gas stream of nitrogen, and subsequently, when silicon etching begins in the vacuum chamber, switching over to pure oxygen as the protective gas and reactive gas, which has a highly inhibiting effect on polymerization, thus very effectively breaking down harmful substances into gaseous, volatile end products through oxidation in the turbomolecular pump. This procedure has the advantage that nitrogen, which in ordinary systems is provided from a practically inexhaustible fluid tank, is cheaper than oxygen, which is usually stored in pressurized cylinders.

Provided that reactive gas is not added through the bearing zones of the turbomolecular pump, i.e., not via the protective gas supply line, it is further advantageously possible to use not only oxygen, air or an oxidized gas, but also another highly effective polymerization-suppressing reactive gas which, due to its corrosive properties, would not otherwise be allowed to enter the bearing zone of the turbomolecular pump. In particular, nitrogen oxide, fluorine, chlorine, chlorine trifluoride or a mixture of at least two of these gases may be added as the reactive gas to the gas to be pumped.

Chlorine trifluoride, in particular, has a very pronounced, spontaneous purification effect at the higher pressures (>1 mbar) that occur in the exhaust area of a vacuum pump or the area of the rear stator and rotor blades of a turbomolecular pump, i.e., it very effectively prevents polymerization and actively removes existing impurities at a high rate.

When using a reactive gas of this type, it is thus now also possible to add it to the gas to be pumped only from time to time, in particular periodically, within purification cycles and thus flush the turbomolecular pump to remove polymers accumulating there and other deposits such as sulfur. It is also possible to regenerate heavily contaminated and polymer-covered turbomolecular pumps in this manner before the rotor and stator blades come into contact with each other and ultimately destroy the pump. In this case, it is especially advantageous to first work for a certain period of time without or with only an insufficient amount of reactive gas, for example compressed air, allowing a certain amount of deposits to accumulate in the exhaust area of the vacuum system and, in particular, within the turbomolecular pump before subsequently adding chlorine trifluoride to the reactive gas during a regeneration cycle. The regeneration interval is determined depending on the vacuum pump design and the tendency of the processes carried out within the vacuum pump to deposit contaminants in the exhaust area.

DETAILED DESCRIPTION

The illustrated exemplary embodiment is initially based on a method of anisotropic etching of silicon, as is known from German Patent No. 42 41 045. In particular, an anisotropic plasma etching process of a structure defined by an etching mask, in particular precisely defined lateral recesses, is carried out in silicon within a vacuum chamber 10, the anisotropic etching process being carried out in separate, alternating consecutive etching steps and polymerization steps that are controlled independently of each other. In particular, a polymer is applied to a lateral limit of the structure defined by the etching mask during the polymerization steps and then removed again during the subsequent etching step.

Fluorohydrocarbons preferably having a low fluorine to carbon ratio, for example $C_4F_8$, $C_3F_6$ or $CHF_3$, which are mixable with argon, are further supplied to vacuum chamber 10 during the polymerization steps. Sulfur hexafluoride, which is also mixable with argon, is used during the etching steps.

On the whole, the plasma etching process according to the exemplary embodiments described below is initially carried out according to the subject matter of German Patent No. 42 41 045, with the exception of the manner described for avoiding or eliminating deposits in the exhaust area of vacuum system 10, and the vacuum chamber described in this publication is also used. Details on the plasma etching process implemented may also be found in German Published Patent Application No. 198 26 382, which provides a detailed description, in particular, of the reaction mechanism and process parameters during the etching steps and the polymerization steps as well as the addition of 3 vol. % to 40 vol. % oxygen to the etching gas.

Figure 1:
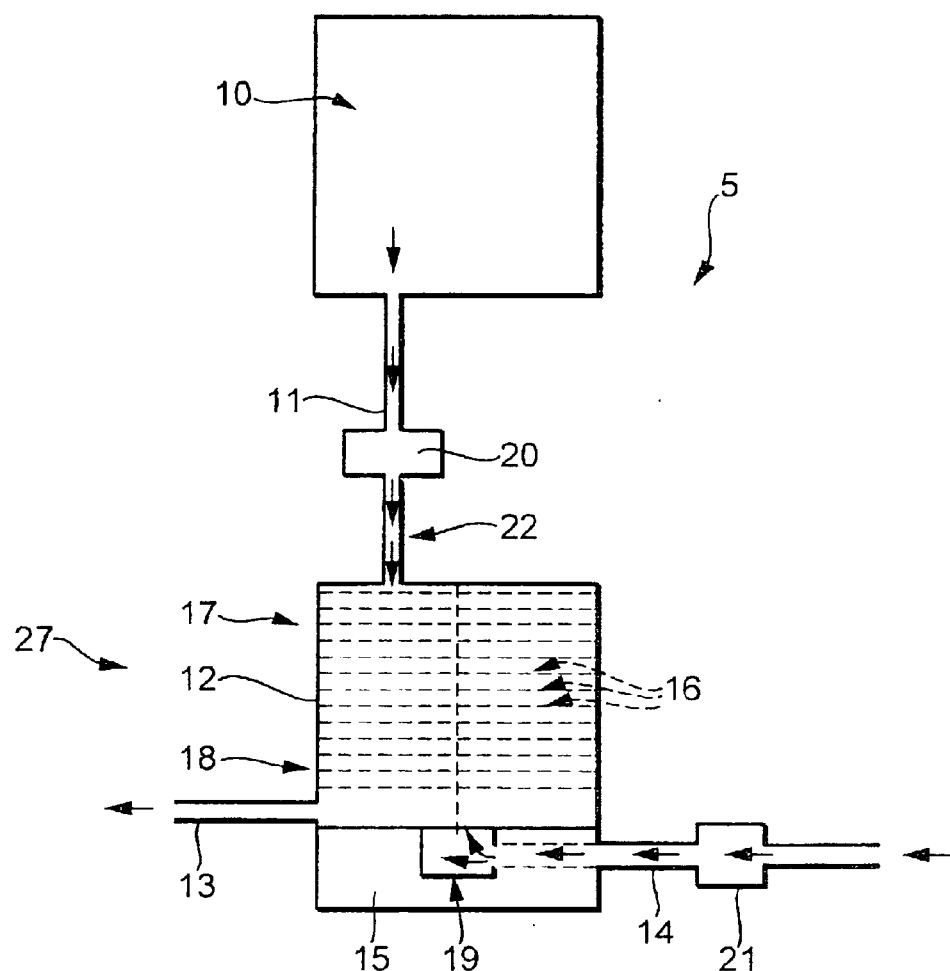
FIG. 1 shows a schematic sketch of a vacuum system having a vacuum chamber and an exhaust area as a first exemplary embodiment.

FIG. 1 shows a first exemplary embodiment of the present invention. For this purpose, a vacuum system 5 is provided in the form of a plasma etching system that includes a vacuum chamber 10 having a downstream exhaust area 27.

Exhaust area 27 further has a gas line 11 that is connected to vacuum chamber 10 and to a turbomolecular pump 12. Turbomolecular pump 12 is used as the vacuum pump to pump out gas present in vacuum chamber 10, a pressure regulating valve 20 also being preferably provided between turbomolecular pump 12 and vacuum chamber 10.

In the illustrated embodiment, turbomolecular pump 12 is a commercially available, chemical-resistant turbomolecular pump having a bearing and motor unit 15 and, located above it, a rotor/stator arrangement 16 including a plurality of rotor/stator pairs.

The gas pumped out of vacuum chamber 10 passes through gas line 11 and enters turbomolecular pump 12 in an entry area 22 thereof, i.e., in the area of inlet opening 22, where it is conveyed from a front pump area 17 to a rear pump area 18, where it is further supplied to system components downstream from turbomolecular pump 12, for example a backing pump, via an outlet opening, i.e., gas discharge opening 13.

According to FIG. 1, turbomolecular pump 12 also has an ordinary protective gas supply line 14 leading to a bearing flushing device 19 of turbomolecular pump 12. This protective gas supply line 14 is further provided with an ordinary protective gas valve 21 having a mass flow regulator so that pure oxygen or compressed air is suppliable to rear area 18 of turbomolecular pump 12 via protective gas supply line 14 or bearing flushing device 19 and enters turbomolecular pump 12 in the area of the latter's last rotor/stator packet, where it oxidizes and thus renders harmless polymerizable constituents contained in the pumped gas such as sulfur, sulfur compounds, decomposition products produced in a plasma as well as fluorine-containing constituents such as sulfur fluoride, in particular $SF_6$, or decomposition products of carbon produced in a plasma and fluorine-containing compounds such as $C_xF_y$, in particular $C_4F_8$ or $C_3F_6$.

According to an advantageous refinement of the illustrated exemplary embodiment, the reactive gas is supplied only intermittently, namely in particular when a silicon wafer is actually being processed in vacuum chamber 10, while nitrogen is supplied as usual as the protective gas via bearing flushing device 19 of turbomolecular pump 12 at all other times, i.e., when the plasma etching system is idle. The quantity of reactive gas to be supplied is determined on an individual basis through simple preliminary trials.

Figure 2:
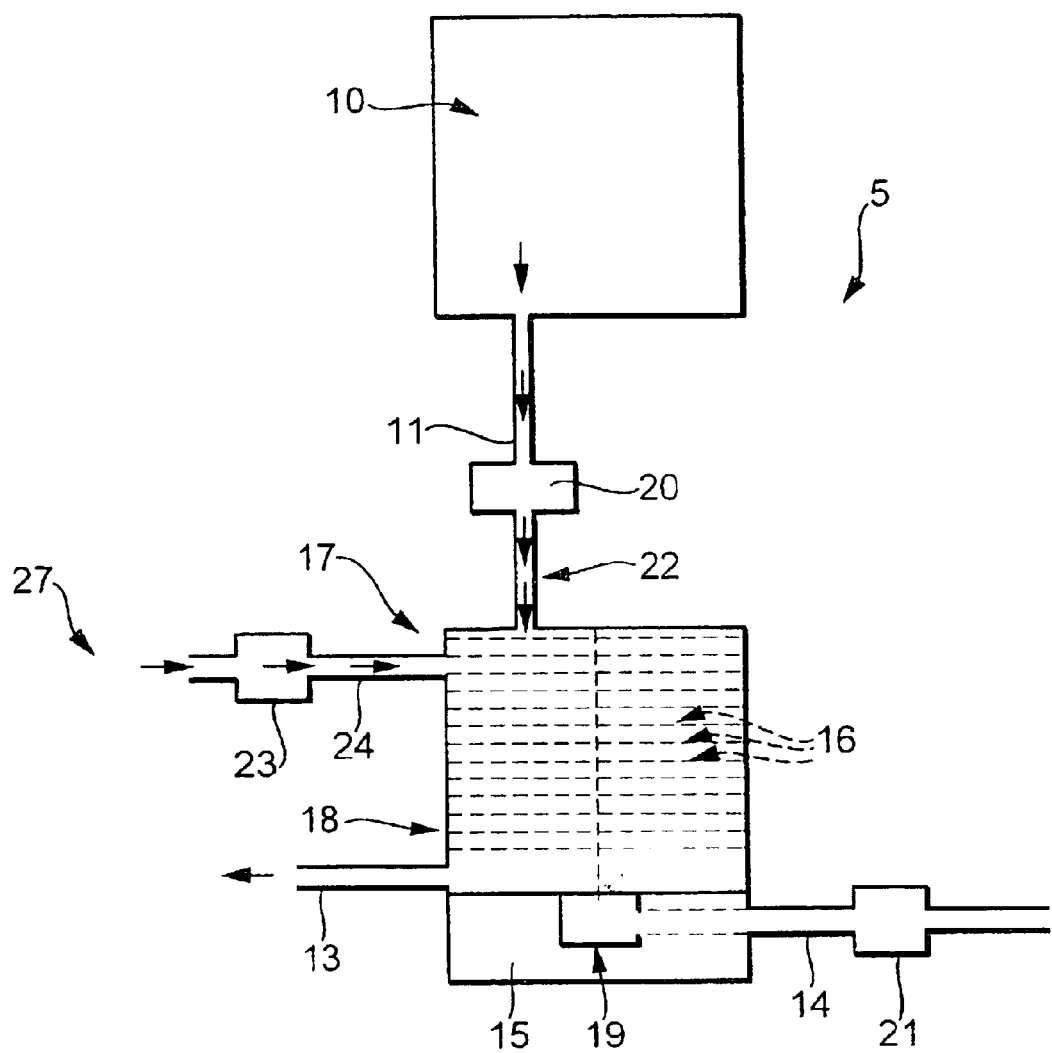
FIG. 2 shows an alternative embodiment to FIG. 1.

FIG. 2 shows an exemplary embodiment of the method according to the present invention as an alternative to FIG. 1, in which nitrogen is first supplied to turbomolecular pump 12 in the usual manner via bearing flushing device 19. To supply reactive gas according to FIG. 2, the gas is supplied via a first gas inlet 24 and a first upstream gas inlet valve 23 having a mass flow regulator in the area of rotor/stator arrangement 16 of turbomolecular pump 12. Commercially available turbomolecular pumps frequently have corresponding gas inlets 24 for analyzing the pressure curve. As a result, the stator and rotor blades located in front pump area 17 are also effectively protected against deposits or cleaned thereof even though such deposits are less significant here than in rear pump area 18.

Figure 3:
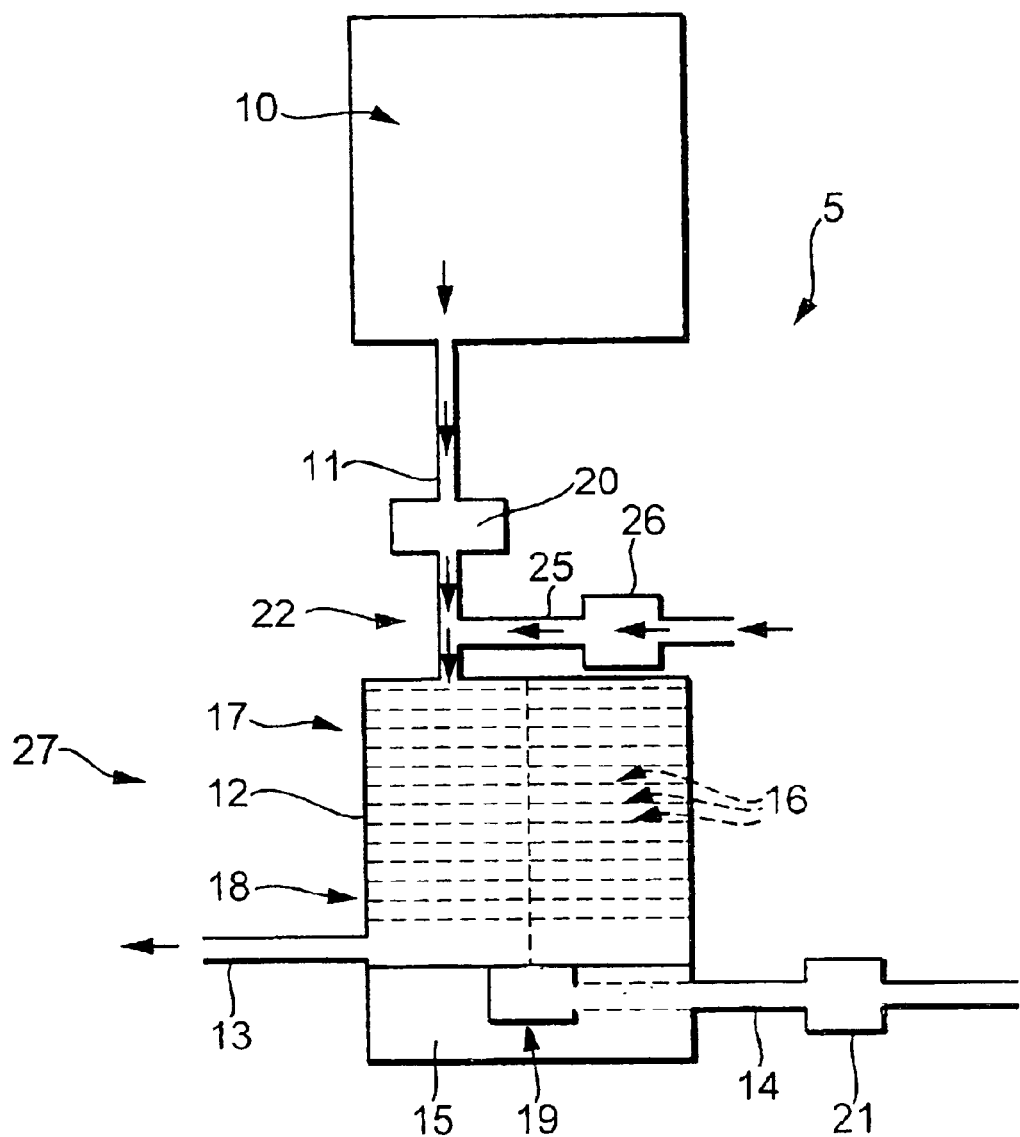
FIG. 3 shows a further alternative embodiment to FIG. 1.

FIG. 3 shows a third exemplary embodiment of the method according to the present invention, which differs from the exemplary embodiments according to FIGS. 1 and 2 only in that the reactive gas is supplied directly upstream from turbomolecular pump 12, i.e., upstream from entry area 22 having the inlet opening and downstream from pressure regulating valve 20. Pressure regulating valve 20 is, for example, a butterfly valve or a plate valve.

Specifically, the reactive gas is supplied according to FIG. 3 via a second gas inlet 25 having a second upstream gas inlet valve 26 that includes a mass flow regulator, second gas inlet 26 being preferably positioned as close as possible to inlet opening 22 to prevent any back diffusion of the added reactive gas into vacuum chamber 10, since this may interfere with the processes taking place there.

According to a refinement of the exemplary embodiments shown in FIGS. 2 and 3, another gas which effectively suppresses the formation of deposits such as polymers and is not allowed to be supplied to bearing flushing device 19 due to its corrosive properties is initially at least intermittently added as the reactive gas to the pumped gas via first gas inlet 24 or second gas inlet 25 instead of compressed air or oxygen. A gas of this type is, for example, a nitrogen oxide, chlorine, fluorine or preferably chlorine trifluoride.

The admixture of a reactive gas to the gas pumped out of vacuum chamber 10 in exhaust area 27 may also take place simultaneously at different locations, i.e., the exemplary embodiments described above may be combined.

What is claimed is:

1. A method of one of avoiding and eliminating deposits in an exhaust area of a vacuum system in which a gas containing constituents that are depositable in the exhaust area is at least intermittently pumped out of a vacuum chamber connected to a vacuum pump via a gas line, comprising the step of:

intermittently adding to the gas one of directly upstream from and within the vacuum pump a reactive gas that at least one of:
prevents the deposits from the gas in another area including at least one of the vacuum pump and a unit provided downstream therefrom, and
one of reduces and eliminates existing deposits in the other area, wherein the deposits include non-sulfur deposits.

2. The method according to claim 1, wherein:

the vacuum pump includes a turbomolecular pump, to which the reactive gas is supplied at least one of:

directly upstream from an inlet opening thereof in an inlet area, in a rear area of the turbomolecular pump via a bearing flushing device serving as a protective gas supply line, and via a gas inlet located in an area of a rotor/stator arrangement of the turbomolecular pump.

3. The method according to claim 1, wherein:

the gas includes one of polymerizable constituents, sulfur, sulfur compounds, decomposition products of sulfur produced in a plasma, fluorine-containing compounds including one of $SF_6$ and $SF_4$, decomposition products of carbon produced in the plasma, and fluorine-containing compounds including one of $C_4F_8$ and $C_3F_6$, and a mixture including at least two of the polymerizable constituents, sulfur, the sulfur compounds, the decomposition products of sulfur produced in the plasma, the fluorine-containing compounds including one of $SF_6$ and $SF_4$, the decomposition products of carbon produced in the plasma, and the fluorine-containing compounds including one of $C_4F_8$ and $C_3F_6$.

4. The method according to claim 1, wherein:
the reactive gas includes:
an inert gas including one of nitrogen and argon, and
one of oxygen, air, an oxygen-containing gas, a nitrogen oxide, fluorine, chlorine, chlorine trifluoride, and a mixture of at least two of oxygen, air, the oxygen-containing gas, the nitrogen oxide, fluorine, chlorine, and chlorine trifluoride.

5. The method according to claim 1, further comprising:
performing an anisotropic plasma etching of silicon using alternating etching steps and polymerization steps in the vacuum chamber;
supplying the vacuum chamber with a sulfur-containing etching gas during the etching steps and a polymerizing agent-containing gas during the polymerization steps; and
causing the vacuum pump to pump out from the vacuum chamber at least one of the sulfur-containing etching gas, the polymerizing agent-containing gas, and one of reaction products and decomposition products thereof, the vacuum pump being located in the exhaust area of the vacuum system.

6. The method according to claim 1, further comprising:
at least intermittently supplying the vacuum chamber with at least one of an etching gas and a passivating gas for carrying out an etching process in the vacuum chamber, the at least one of the etching gas and the passivating gas corresponding to a pumped gas; and
adding the reactive gas to the pumped gas one of only during and intermittently during the supplying of the at least one of the etching gas and the passivating gas.

7. The method according to claim 6, wherein:
one of no gas and no inert gas is added to the pumped gas at least one of before and after completion of the etching process.

8. The method according to claim 7, wherein:
the inert gas includes nitrogen.

9. The method according to claim 1, wherein:
the reactive gas is added to the gas in such a manner that one of no back diffusion and only negligible back diffusion of the reactive gas into the vacuum chamber occurs.

10. The method according to claim 1, wherein:
the reactive gas is periodically added to the gas within regeneration cycles during the course of which deposits forming in the exhaust area are at least partially removed.

11. The method according to claim 10, wherein:
the reactive gas includes chlorine trifluoride.

12. The method according to claim 1, wherein:
the non-sulfur deposits include polymers.

* * * * *